United States Patent
Berrabah et al.

(10) Patent No.: US 11,061,060 B2
(45) Date of Patent: Jul. 13, 2021

(54) METHOD AND SYSTEM FOR LOCATING DEFECTS ON AN ELECTRIC CABLE

(71) Applicants: Electricite de France, Paris (FR); Institut Natitonal De Recherche En Informatique Et En Automatique, Rocquencourt (FR)

(72) Inventors: Nassif Berrabah, Moret-sur-Loing (FR); Qinghua Zhang, Cesson-Sevigne (FR)

(73) Assignees: Electricite de France; Institut Natitonal De Recherche En Informatique Et En Automatique

( * ) Notice: Subject to any disclaimer, the term of this patent is extended or adjusted under 35 U.S.C. 154(b) by 243 days.

(21) Appl. No.: 16/320,868

(22) PCT Filed: Jul. 28, 2017

(86) PCT No.: PCT/EP2017/069206
§ 371 (c)(1),
(2) Date: Jan. 25, 2019

(87) PCT Pub. No.: WO2018/020019
PCT Pub. Date: Feb. 1, 2018

(65) Prior Publication Data
US 2019/0162772 A1    May 30, 2019

(30) Foreign Application Priority Data
Jul. 29, 2016    (FR) .................................. 1657416

(51) Int. Cl.
*G01R 31/08*    (2020.01)
*G01R 27/06*    (2006.01)
(Continued)

(52) U.S. Cl.
CPC ........... *G01R 31/083* (2013.01); *G01R 27/06* (2013.01); *G01R 27/32* (2013.01); *G01R 31/08* (2013.01);
(Continued)

(58) Field of Classification Search
CPC ...... G01R 31/083; G01R 31/58; G01R 31/08; G01R 31/44; G01R 27/06; G01R 27/32; H04B 3/46
(Continued)

(56) References Cited

U.S. PATENT DOCUMENTS 3,248,646 A * 4/1966 Brazee ................... G01R 31/08
324/519
4,424,479 A * 1/1984 Brown ................. G01R 31/083
324/525
(Continued)

FOREIGN PATENT DOCUMENTS

KR    100957812 B1 *   5/2010    ........... G01R 31/085
KR    100957812 B1      5/2010

OTHER PUBLICATIONS

Dasco, A., Marguet, R. and Raison, B., Jun. 2015. Fault distance estimation in distribution network for high impedance faults. In 2015 IEEE Eindhoven PowerTech (pp. 1-6). IEEE. (Year: 2015).*
(Continued)

*Primary Examiner* — Christopher P McAndrew
(74) *Attorney, Agent, or Firm* — Lerner, David, Littenberg, Krumholz & Mentlik, LLP

(57) ABSTRACT

The present invention relates to a method for diagnosing defects on a cable, including the following steps: measuring parameters S of the cable; determining the apparent impedance of the cable as a function of the position z along the cable, from one end of the cable $Z^l(z)$, as well as from the other end of the cable $Z^r(z)$; determining an estimation of the
(Continued)

Figure 1:
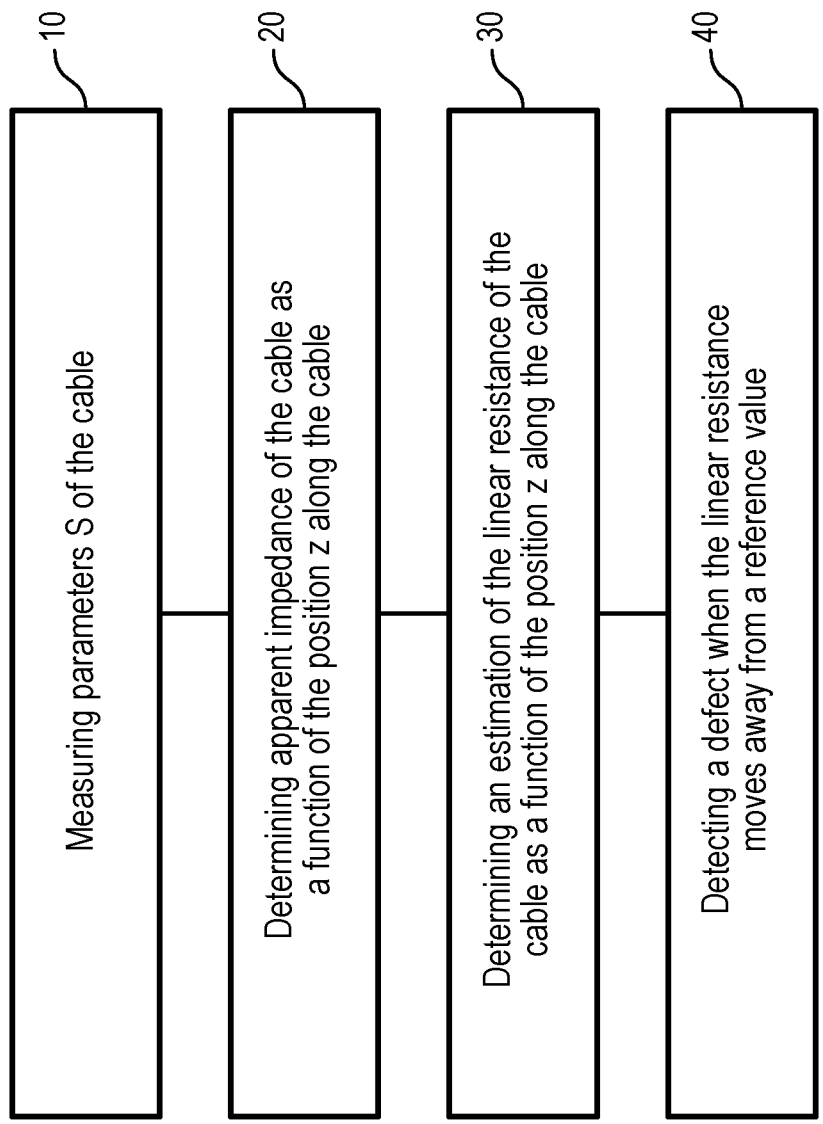

linear resistance R(z) of the cable as a function of the position z along the cable; and detecting a defect on a cable when the estimated linear resistance R(z) deviates from a reference value.

9 Claims, 4 Drawing Sheets

(51) Int. Cl.
    *G01R 27/32*     (2006.01)
    *G01R 31/44*     (2020.01)
    *G01R 31/58*     (2020.01)
    *H04B 3/46*     (2015.01)

(52) U.S. Cl.
    CPC ............ *G01R 31/44* (2013.01); *G01R 31/58* (2020.01); *H04B 3/46* (2013.01)

(58) Field of Classification Search
    USPC ....................................................... 324/512
    See application file for complete search history.

(56) References Cited

U.S. PATENT DOCUMENTS

| | | | |
|---|---|---|---|
| 2002/0024342 A1* | 2/2002 | Bussinger | G01R 31/083 324/541 |
| 2013/0124119 A1* | 5/2013 | Reynaud | G01R 31/11 702/59 |
| 2013/0204555 A1 | 8/2013 | Scheuschner et al. | |

OTHER PUBLICATIONS

Tang, H. and Zhang, Q., 2010. Lossy Electric Transmission Line Soft Fault Diagnosis: an Inverse Scattering Approach. (Year: 2010).*

"Agilent Technologies 8510C Network Analyzer System Operating and Programming Manual", May 1, 2001, pp. 11.3-11.13.

"IConnect and MeasureXtractor Signal Integrity TDR and S-Parameter Software", Tektronix, Jan. 1, 2007, 8 pages.

Dmitriev-Zdorov, et al., "Computation of Time Domain Impedance Profile from S-Parameters: Challenges and Methods", DesignCon 2013, Dec. 31, 2014, 28 pages.

French Search Report for FR Application No. 1657416, dated Apr. 5, 2017.

Griffiths, et al., "The Invisible Fray: A Critical Analysis of the Use of Reflectometry for Fray Location", IEEE Sensors Journal, vol. 6, No. 3, Jun. 2006, pp. 697-706.

International Search Report for PCT/EP2017/069206, dated Nov. 7, 2017.

Norgren and He, "An Optimization Approach to the Frequency-Domain Inverse Problem for a Nonuniform LCRG Transmission Line", IEEE Transactions on Microwave Theory and Techniques, vol. 44, No. 8, Aug. 1996, pp. 1503-1507.

Schuet, et al., "A Model-Based Probalistic Inversion Framework for Characterizing Wire Fault Detection Using TDR", IEEE Transactions on Instrumentation and Measurement, vol. 60, No. 5, May 2011, pp. 1654-1663.

Schuet, S., "Wiring Diagnostics Via I1-Regularized Least Squares", IEEE Sensors Journal, vol. 10, No. 7, Jul. 2010, pp. 1218-1225.

Tang and Zhang, "An Efficient Inverse Scattering Algorithm and Its Application to Lossy Electric Transmission Line Synthesis", PIERS Online, vol. 24, Jan. 1, 2011, pp. 77-90.

Tang and Zhang, "An Inverse Scattering Approach to Soft Fault Diagnosis in Lossy Electric Transmission Lines", IEEE Transactions on Antennas and Propagation, vol. 59, No. 10, Oct. 1, 2011, pp. 3730-3737.

Zhang, et al., "Inverse Scattering for Soft Fault Diagnosis in Elecric Transmission Lines", IEEE Transactions on Antennas and Propagation, vol. 59, No. 1, Jan. 1, 2011, pp. 141-148.

* cited by examiner

METHOD AND SYSTEM FOR LOCATING DEFECTS ON AN ELECTRIC CABLE

CROSS-REFERENCE TO RELATED APPLICATIONS

The present application is a national phase entry under 35 U.S.C. § 371 of International Application No. PCT/EP2017/069206, filed Jul. 28, 2017, which claims priority from French Patent Application No. 1657416, filed Jul. 29, 2016, all of which are incorporated herein by reference.

TECHNICAL FIELD

The present invention relates to the field of detecting defects in electrical cables.

PRIOR ART

Many industrial products and systems utilise cables for data transfer (measurements, commands) for conveying electrical energy (powering equipment, transport of electricity). Effective and safe operation of these systems requires cables in good condition and an adapted maintenance policy.

In this context, it becomes necessary to have tools for inspecting the state of degradation and/or ageing of wired links. This concerns knowing how to detect, locate and identify the defects which could affect cables.

These defects can occur over the entire length of the cable, and can mean an overall defect.

Faults can also concern just a particular portion of the length of a cable. This is the case for so-called local defects.

Also, defects are distinguished according to whether they are dead shorts (open circuit, short-circuit) making the cable inoperative, or soft without immediate serious consequence on the operation of the system (degradation of conductors, ageing of insulators, modified geometry of the cable, etc.). The latter can however be considered as precursor signs of severer degradation.

Existing techniques (in particular reflectometry) offer satisfactory performance in terms of detection and location of bolted defects.

But, diagnosis is made more difficult when soft defects are involved. In fact, standard reflectometry is based on the fact that the signals electrical which travel in a cable are reflected partially or fully when they encounter a variation in its electrical properties. In the case of soft defects, these reflections can be very weak and their detection/interpretation in measurements tainted by noise made all the more difficult (cf. [1]). Also, the occurrence of multiple reflections can complicate diagnosis work even more.

Although methods classically used for detecting soft defects are still utilizing reflectometry technology, a major disadvantage of these techniques is that a large part of the wave is not reflected, resulting in inadequate detection of defects.

Yet, soft defects can constitute indicators of ageing of a cable and/or warning signs of more substantial flaws. It is therefore preferable to use techniques and methods for detecting, locating and characterizing defects. This would mean putting preventive maintenance in place and avoiding extra costs linked to interruption of the operation following malfunction.

There are methods for diagnosis of soft defects which are based on resolving optimisation problems, but these methods are generally very costly in terms of numerical calculations [3, 4, 2]. In [5], a numerically efficient method is proposed for diagnosing soft defects characterized by slight variations in impedance, especially without discontinuity of impedance, but neglecting electrical power losses, therefore not adapted to defects characterized by the increase in resistance of conductors.

Document KR 100957812 [6] proposes a method for detection of the location of a defect by detection of coincidence between impedances measured from both ends of a cable, without specifying the nature of the defects. It does not quantify a resistive defect in terms of the linear resistance $R(z)$.

Other techniques are described in documents [7] to [12] listed at the end of the description.

SUMMARY OF THE INVENTION

In the context of the prior art summarized hereinabove, the aim of the present invention is to propose a method for detection, location and estimation of soft resistive defects within the scope of diagnosis of cables.

As indicated hereinabove, if it fails to prevent data transmission, a soft defect still constitutes an indicator of ageing, and therefore of degradation of the cable.

The above aim is achieved according to the invention by way of a method for diagnosis of defects on a cable comprising the following steps:

Measuring the matrix of the parameters S of the cable comprising the parameters S11, S12, S21 and S22 as a function of the frequency, typically with a network analyser (when the reference impedance is adapted to the cable, S11 and S22 correspond to the reflection coefficients at both ends, and S12 and S21 to the transmission coefficients in both directions);

Determining the apparent impedance of the cable as a function of the position z along the cable, both $Z^l(z)$ from one end of the cable by connecting a charge adapted to the other end, and also $Z^r(z)$ similarly from the other end of the cable;

Determining an estimation of the linear resistance $R(z)$ («linear» means «per unit of length») of the cable as a function of the position z along the cable from the values of apparent impedance $Z^l(z)$ and $Z^r(z)$:

$$R(z) = \frac{[Z^l(z) - Z^r(z)] - [Z^l(z+dz) - Z^r(z+dz)]}{2dz}$$

where dz is the spatial discretisation pitch;

Detecting a defect on the cable when the estimated linear resistance $R(z)$ moves away from a reference value.

The method according to the invention is distinguished especially from document KR 100957812 by the fact that:
a) measuring the reflection coefficients is carried out,
b) estimation of the linear resistance $R(z)$ is performed by way of the formula indicated hereinabove,
c) the defect is detected when the estimated linear resistance $R(z)$ moves away from a reference value.

Therefore whereas usually the values R, L, C and G characterizing a cable (see the model RLCG in «Detailed description of the invention») determine those of the voltage u and of the current i by digital simulation, according to the invention the procedure is in reverse, that is, the linear resistance $R(z)$ is estimated from measuring the values of the voltage and of the current (u and i), which performs diagnosis of the degradation of the cable.

In fact, if the values estimated of R(z) are different to those expected, a defect has been detected.

The invention therefore estimates the function R(z), then the interpretation of the result immediately detects, locates and quantifies any defect.

Conventional algorithms for estimating values of R, L, C and G are generally slow since they are based on optimisation methods with many unknowns. Also often the aim is to optimize a function which can have several extrema, which needs information a priori on the preferred solution.

To mitigate this, according to the invention a digitally effective method is used which estimates R only (i.e. resistive defects).

This is all the more pertinent since resistive defects can be serious (overheating of the cable).

The invention tries to see whether a defect is assigned to R, or when a resulting curve R(z) presents a peak (=local defect), or by comparing R(z) to nominal values.

The invention therefore consists of estimating R(z), which detects resistive defects.

The invention also relates to a system comprising means adapted for executing the above method.

PRESENTATION OF FIGURES

Figure 2:
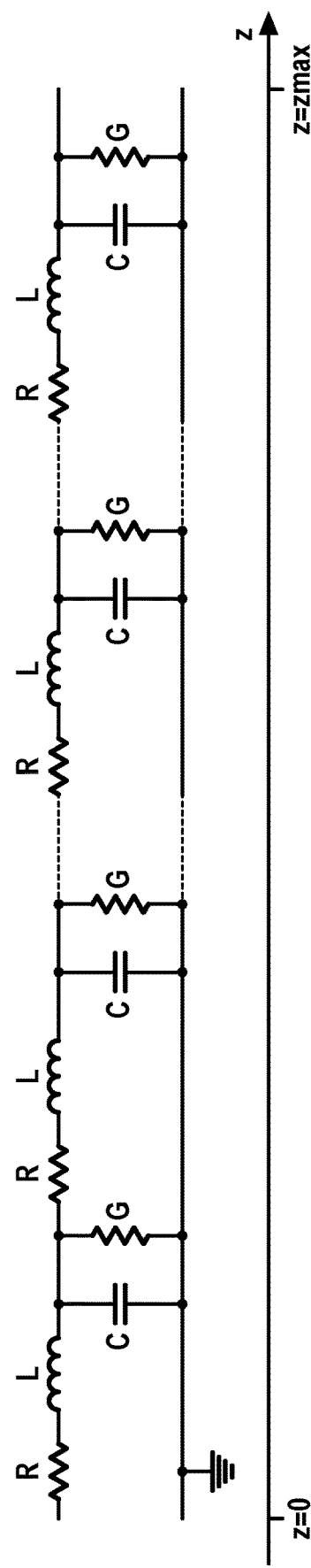
Figure 3:
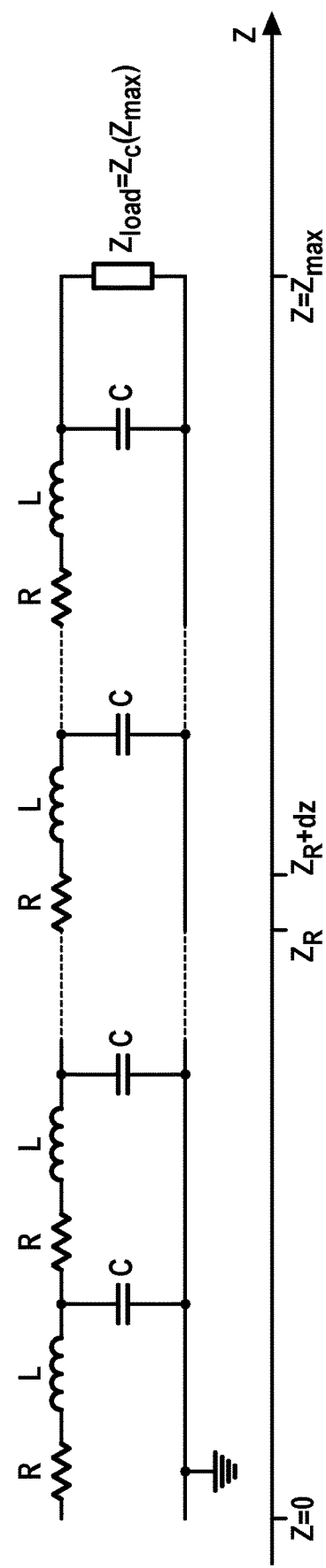
Figure 4:
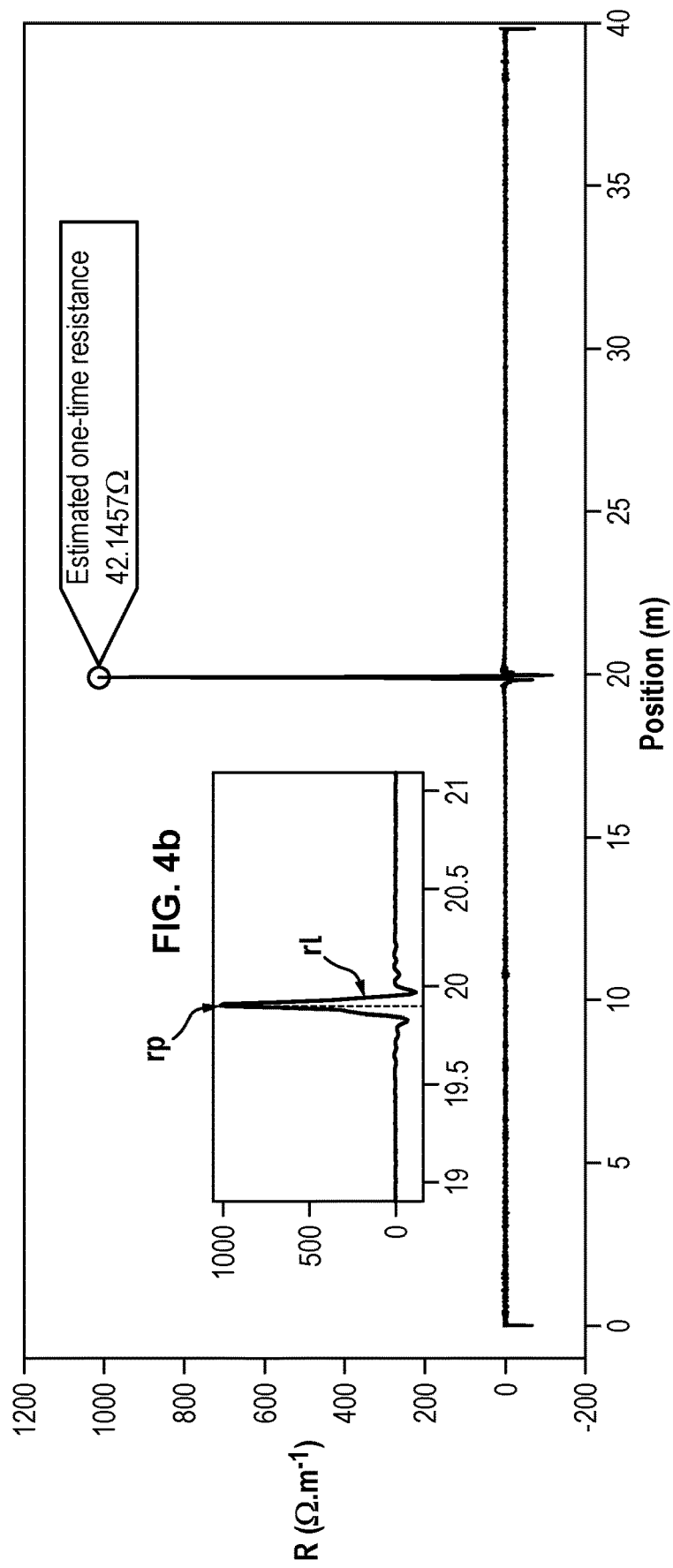
Figure 5:
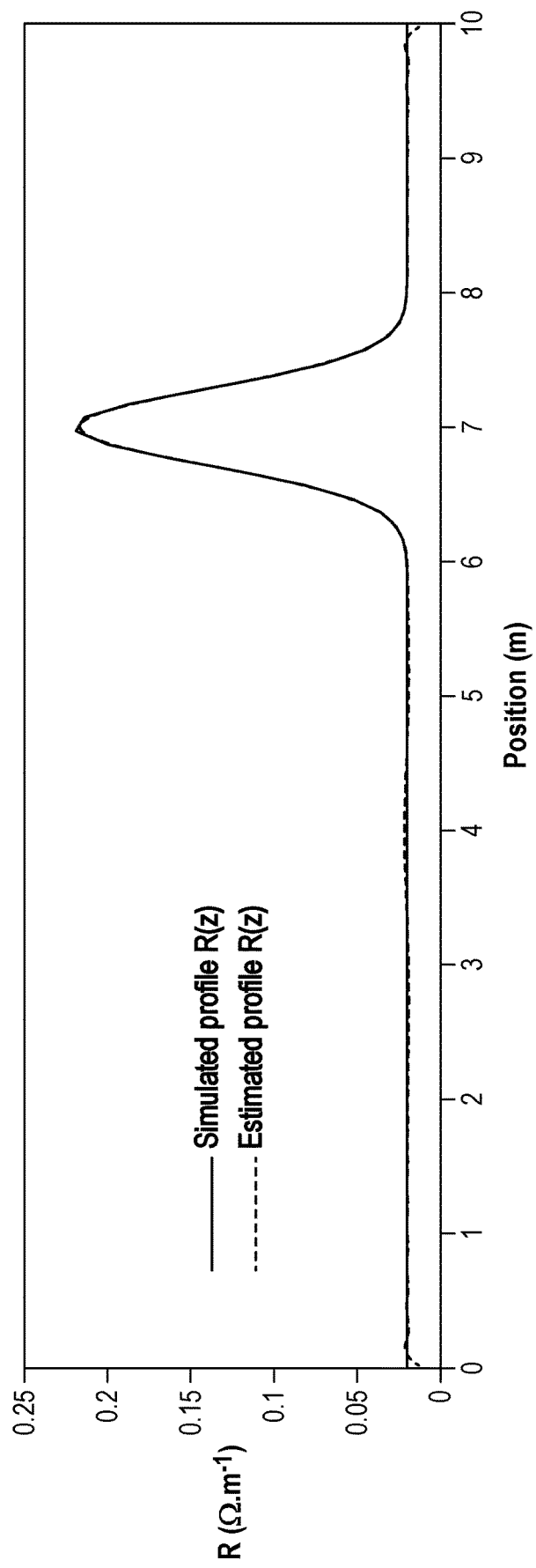

Other characteristics, aims and advantages of the present invention will emerge from the following detailed description and with respect to the drawings given by way of non-limiting examples, in which:

FIG. 1 schematically illustrates in the form of a flowchart the steps of the method according to the present invention, FIG. 2 illustrates the representation of a cable by a model RLCG, FIG. 3 schematically illustrates the effect of the resistance on the apparent impedance of a cable, FIG. 4 represents the result of a test obtained demonstrating detection, location and estimation of a one-time resistor inserted on a cable, by means of the method according to the invention, more precisely FIG. 4a showing the linear resistance R(z) as a function of the position on the cable and estimation of the one-time resistor, while FIG. 4b shows a zoom around the peak corresponding to the inserted resistor, and FIG. 5 represents simulation results validating the assumptions of the method according to the present invention, by showing the resistance of the cable as a function of the position z on the cable.

DETAILED DESCRIPTION OF AN EMBODIMENT

The method for locating and estimating ohmic losses on a cable according to the present invention can be utilized to detect, locate and estimate defects revealed by locally or overall more substantial resistance and also able to cause unwanted heating. The estimation of these losses can also be compared to reference values for ruling on the state of ageing of the inspected cable.

Also, when the presence of a defect is detected, the proposed method removes the ambiguity as to its nature (resistive or impeding). In fact a cable is characterized by the parameters RLCG distributed over the entire length of the cable. The method according to the invention estimates linear resistance R(z). This distinguishes the defects affecting the linear resistance of those which affect the characteristic impedance.

Before describing the invention in the detail, reminders of the theory of transmission lines will be given.

A cable is constituted by two conductors (or more) separated by an insulator. A cable is a transmission line which is usually modelled (in some conditions) by a model RLCG such as illustrated in FIG. 2. In some conditions, this classic model RLCG characterizes the propagation of current and voltage waves. In this model, the cable is represented by a succession of sections each able to be represented by a quadrupole RLCG as shown in FIG. 2. In this model the elements R and L are arranged in series on a branch located between the input and output of each section, while the elements C and G are arranged in parallel between the two outlet ports.

This is a model having distributed constants. The values of R, L, C and G in fact depend on the position on the cable:

R(z) represents the linear resistance of conductors at the abscissa point z.

L(z) represents the intrinsic linear inductance of the cable at the abscissa point z.

C(z) represents the linear capacity of the cable at the abscissa point z.

G(z) represents the linear conductivity of the insulator at the abscissa point z.

When the number of sections tends to be infinite and the length of each section tends towards zero, this scheme tends towards the limit described by the equations of the telegraphers. The waves of voltage and current which spread in the cable are governed by the equations of the telegraphers:

$$\frac{\partial u}{\partial z}(z, t) = -R(z)i(z, t) - L(z)\frac{\partial i}{\partial t}(z, t) \quad (1a)$$

$$\frac{\partial i}{\partial z}(z, t) = -G(z)u(z, t) - C(z)\frac{\partial u}{\partial t}(z, t) \quad (1b)$$

where u (z,t) and i(z,t) represent respectively the voltage and the current at the point z and at the instant t.

Therefore, given the profiles R(z), L(z), C(z) and G(z) and the initial conditions and at the limits, the voltages and currents in a cable can be calculated. This constitutes a direct model which deduces the propagation of waves in the cables and makes digital simulations.

The parameters R(z), L(z), C(z) and G(z) depends on the physical characteristics of the cable at its abscissa point z (its geometry, the electrical properties of the conductors and of the insulator, etc.). Degradation of the cable can impact one or more of these parameters. Estimating the parameters RLCG from measurable quantities constitutes a degradation diagnosis method. If the equations (1) are in a form adapted to digital simulation of the cable (calculation of voltage and current from linear parameters and initial conditions and at the limits), then calculation of linear parameters from available measurements (voltages and currents at the ends of the cable) requires these equations to be inverted in a certain way and constitutes a much more difficult problem. The latter is usually called inverse problem, in contrast to the direct problem of digital simulation.

The method of the invention is based on this approach.

More precisely, the invention is based on the following assumptions and calculations.

The equations (1a) and (1b) are represented in the frequential range via Fourier transform $$\frac{\partial u}{\partial z}(z, \omega) = -R(z) - j\omega L(z)i(z, \omega) \quad (2a)$$

-continued $$\frac{\partial i}{\partial z}(z,\omega) = -G(z) - j\omega C(z)u(z,\omega) \quad (2b)$$

where ω represents the pulsing of the excitation signal.

Two quantities are defined (generally different):

The characteristic impedance of the cable $$Zc(z,\omega) = \sqrt{\frac{R(z) + j\omega L(z)}{G(z) + j\omega C(z)}}$$

The apparent impedance of the cable $$Z(z,\omega) = \frac{u(z,\omega)}{i(z,\omega)}$$

Hereinbelow, in these notations the dependence at ω will be omitted for notations Zc(z) and Z(z) shorter.

The effect of R(z) on the apparent impedance Z(z) can be described by a simple relationship. The apparent impedance Z(z) depends on the electrical components connected to the tested cable. Noted $Z^l(z)$ (respectively $Z^r(z)$) is the apparent impedance at the point z when the cable is tested by connecting an instrument to the end left (respectively right) of the cable and by terminating the right end (respectively left) with an adapted charge. The difference in impedance between the abscissa points z and z+dz is also noted dZ(z) in the event where the ohmic losses are absent. Modelling ohmic losses on the section between the abscissa points z and z+dz by resistance equal to R(z)dz, as illustrated by FIG. 3 gives:

$$Z^l(z) = Z^l(z+dz) - dZ(z) + R(z)dz \quad (3a)$$

$$Z^r(z) = Z^r(z+dz) - dZ(z) - R(z)dz \quad (3b)$$

and this is deduced from it $$R(z) = \frac{[Z^l(z) - Z^r(z)] - [Z^l(z+dz) - Z^r(z+dz)]}{2dz}$$

In practice, instead of making two measurements by first connecting an adapted charge to the right then another to the left, typically the two ends of a cable are connected to both ports of a network analyser to obtain once only the matrix of the parameters S for determining the apparent impedances $Z^l(z)$ and $Z^r(z)$, and applying the method described.

In other terms, the invention comprises steps consisting of:
1. Measuring the matrix of the parameters S of a cable by connecting its two ends to the two ports of a network analyser;
2. Determining the apparent impedances $Z^l(z)$ and $Z^r(z)$ (a method for conducting this step will be presented later by way of example);
3. Then estimating R(z):

$$R(z) = \frac{[Z^l(z) - Z^r(z)] - [Z^l(z+dz) - Z^r(z+dz)]}{2dz} \quad (5)$$

4. Detecting a defect when the estimated linear resistance R(z) moves away from a reference value.

The determination of apparent impedances $Z^l(z)$ and $Z^r(z)$ at step 2 of the invention can be carried out by any available method. By way of example, a digitally effective method based on the «inverse scattering» theory is presented here, originally intended for estimation of the characteristic impedance of a cable without losses, as described in document [5] «Qinghua Zhang, Michel Sorine, and Mehdi Admane. *Inverse scattering for soft defect diagnosis in electric transmission lines. IEEE Transactions on Antennas and Propagation,* 59(1):141-148, 2011».

The process described in [5] aims to obtain the characteristic impedance of the cable without losses $$Z_0(z) = \sqrt{\frac{L(z)}{C(z)}}$$

from the reflection coefficient r(ω), which is equal to S11 or to S22 of the matrix of parameters S, according to whether one or the other end of the cable is selected as the origin of the abscissa z. It comprises the following steps:

1) A change in variable is first made:

$$x(z) = \int_0^z \sqrt{L(s)C(s)}\,ds$$

2) the inverse Fourier transform of the reflection coefficient is calculated $$\rho(x) = \frac{1}{2\pi}\int_{-\infty}^{+\infty} r(\omega)\exp(j\omega x)\,d\omega$$

3) then the integral Gel'fand-Levitan-Marchenko equations are resolved for the cores $A_1(x,y)$ and $A_2(x,y)$:

$$A_1(x,y) + \int_{-y}^{x} A_2(x,s)\rho(y+s)\,ds = 0$$

$$A_2(x,y) + \rho(x+y) + \int_{-y}^{x} A_1(x,s)\rho(y+s)\,ds = 0$$

4) the potential function q(x) is then calculated by $$q(x) = 2A_2(x,x)$$

5) $Z_0(x)$ is then calculated:

$$Z_0(x)\exp(-2\int_0^x q(s)\,ds)$$

In the present invention, this process is diverted to estimate the apparent impedances $Z^l(z)$ and $Z^r(z)$ as follows:

Assuming soft defects or the absence of any defect, the reflected waves are sparsely present in the cable. In this case, the characteristic impedance $Z_0(x)$ calculated from S11 according to the process described hereinabove is approximately equal to $Z^l(x)$, even in the presence of ohmic losses on the cable. Similarly, the characteristic impedance $Z_0(x)$ calculated from S22 is approximately equal to $Z^r(x)$.

The electrical length of the cable (uniform to a period corresponding to the prorogation time of a wave from one end to the other of the cable) is used to faire $Z^l(x)$ and $Z^r(x)$ correspond correctly to estimate R(z). In practice, this electrical distance can be estimated for example by using the coefficient $S_{12}$ (transmission coefficient of the matrix of parameters S) of the cable. In the temporal field, it is zero until receipt of the first signals at an instant which corresponds to the electrical distance.

the propagation speed of waves in the cable (or the physical length of the cable) is used to convert $Z^l(x)$ and $Z^r(x)$ into $Z^l(z)$ and $Z^r(z)$.

Other methods can be used in terms of the present invention to carry out the above estimation process. A non-limiting example is that described on pages 56 to 59 of the thesis «Development of a novel method for determination of profiles of water content in ground by inversion of a TDR signal» Luiz Antonio PEREIRA DOS SANTOS, 20 Nov. 1997—Joseph Fourier University—Grenoble I.

Results

The inventors have conducted tests whereof the results will now be presented.

First a particular case: a one-time resistor placed on the core of a coaxial cable.

This particular case is chosen to experimentally show the efficacy of the method as it is easy to execute. In fact, the creation of distributed defects in a controlled manner is more difficult experimentally.

For this reason the second result which will be presented later will be based on simulated measurements. It will reveal the interest of the method for distributed defects (one-off).

The method is laboratory-tested as follows:

A one-time resistor is inserted on the core of a cable.

The presence of the one-time resistor is shown by a peak on the profile the linear resistance R(z), described mathematically by a Dirac function. In practice, measurements are made with a finite spectrum, in a «spreading» effect of the Dirac function. The value of the one-time resistor is estimated by integrating the estimation of R(z) on a proximity of the estimated position of the defect.

In the experiment performed on a 40 m coaxial cable, with a 49.7Ω resistor (measured with a multimeter Fluke 4485 A) inserted 20 m from one end, the resulting estimation is close to reality (42.7Ω). FIG. 4a represents the linear resistance estimated as a function of the position on the cable (rl) and estimation of the one-time resistor (rp) is obtained by the whole peak. FIG. 4b represents a zoom around the peak.

To illustrate the interest of the method according to the invention in the detection and estimation of a one-time defect, the inventors also carried out digital simulation. For this the equations (2) are used to calculate the parameters S of a virtual cable whereof the characteristics (impedance and resistance) are shown in FIG. 5. The method is applied and the results are shown in the same FIG. 5.

It is evident that the variation in resistance is located and estimated with a high degree of precision. Also, the variation in characteristic impedance of the cable does not prevent correct estimation of R(z). The method is therefore robust to moderated variations of the characteristic impedance.

The simulation results obtained therefore confirm the efficacy of the method proposed according to the invention.

The method according to the invention described hereinabove detects and locates ohmic losses in a cable and also estimate their scale. Such diagnosis presents considerable interest for all industrial products and systems having cabled links (aeronautic, power, rail, telecom, etc.). Apart from diagnosis, this method better anticipates damage and therefore optimizes preventive maintenance operations.

Also, this method distinguishes resistive defects (variations in R(z)) of impeding defects (variations in $Z_c(z)$).

Contrary to methods using optimisation techniques [3, 4], the method of the invention needs no information a priori on R(z) and its digital execution is very fast (of the order of a minute on a portable PC).

The method of the invention accordingly constitutes an advance in terms of detection of soft defects. It can be used for example for:
  detection of defective junctions (likely to heat excessively).
  monitoring of ageing of a junction.
  preventive maintenance (prior to occurrence of bolted defects), in an electricity power plant, for example.
  detection of damaged conductors (for example during works due to severe operating conditions).

So above all, the method according to the present invention comprises the following steps as illustrated in FIG. 1:
  a step 10 for measuring parameters S of the cable;
  a step 20 for determining the apparent impedance of the cable as a function of the position z along the cable, both $Z^l(z)$ from one end of the cable, and also $Z^r(z)$ from the other end of the cable;
  a step 30 for determining estimation of the linear resistance R(z) of the cable as a function of the position z along the cable $$R(z) = \frac{[Z^l(z) - Z^r(z)] - [Z^l(z+dz) - Z^r(z+dz)]}{2dz}$$

a step 40 for detection of a defect on a cable when the estimated linear resistance R(z) moves away from a reference value.

Of course, the present invention is not limited to the embodiment previously described, but extends to any variant according to its central idea.

It emerges from the preceding description that the method according to the present invention offers the following results and the following advantages:
  detection location and estimation of soft defects in a cable
  distinguishes the resistive defects of impeding defects
  very fast digital calculation
  no need for information a priori on R(z)
  detection of defective junctions (likely to heat excessively)
  monitoring of ageing of a junction
  useful in terms of a preventive maintenance plan (before the occurrence of bolted defects)
  detection of damaged conductors (corrosion, broken strands, etc).

It should be emphasized that the invention estimates a spatially distributed parameter (R(z) as a function of any position z along the cable), whereas most known methods estimate parameters each of which is represented by a single value for the whole length of a cable, far less rich in information, especially not locating detected defects.

Also, the few existing publications on the estimation of parameters distributed along the cable are based on an approximate discretisation of the cable, not very precise and very costly in calculation time (typically hours or days of calculation for a diagnosis). The method of the invention allows very fine discretisation of the cable (thousands of points) and very fast calculation (of the order of a minute).

According to other advantageous characteristics of the invention:
  the reflection coefficients of the cable at both ends of the cable are obtained by connecting successively a charge adapted respectively to each end of the cable,
  the reflection coefficients S11, S22 of the cable are obtained on a frequency band and with a constant frequency pitch df.

It eventuates from the above that the invention relates to a rapid method for calculating the profile of the linear resistance of an electrical cable with the aim of detecting, locating and quantifying resistive bolted defects or soft faults.

The invention enables a method which has the following advantages and characteristics:

Rapid. Calculation from recording of spectral reflectometry data by the method of the invention is performed over several seconds, in contrast to those methods based on a model-data fitting whereof calculation is typically performed over several hours.

Profile. The result of calculation is a profile of physical parameter (linear resistance), far richer than the detection and location of discontinuities in the cable.

Linear resistance. The method according to the invention is focused on the linear resistance $R(z)$ (resistance per unit of length, a distributed parameter which may vary according to the position z along the cable), which characterizes the transformation of electrical energy into heat. It is important to detect, locate and quantify overheating (excess of heat) which result in more or less localized abnormal increases in $R(z)$. It is fairly easy to evaluate the total resistance of a cable, but much more difficult to calculate the profile of the linear resistance $R(z)$ along the entire cable. To the knowledge of the inventors, this method is the only one which effectively calculates this profile.

Quantifying. Calculating the linear resistance $R(z)$ quantifies resistive defects, whereas most previously known methods detect discontinuities in impedance, which does not quantify resistive defects.

Resistive defects. These are more or less localized increases in the linear resistance $R(z)$, resulting in electrical power losses (otherwise called transformation of the electrical energy into heat) with possibly dangerous overheating zones. Most existing methods detect discontinuities of impedance which do not cause power losses.

Soft defects. Contrary to bolted defects which correspond to severe discontinuities in the properties of a cable, soft defects are manifested by slight variations in these properties, often without discontinuities. The method according to the invention which calculates the profile of the linear resistance applies variously in both cases (dead shorts and soft defects), whereas most previously known methods are based on detection of discontinuities and are therefore limited to bolted defects.

REFERENCES

[1] Lance Allen Griffits, Rohit Parakh, Cynthia Furse, and Britany Baker. The invisible fray: a critical analysis of the use of reflectometry for fray location, 2006.
[2] Martin Norgren and Sailing He. An optimization approach to the frequency-domain inverse problem for a nonuniform LCRG transmission line. IEEE Transactions On Microwave Theory And Techniques, 44(8):1503-1507, 1996.
[3] Stefan Schuet. Wiring diagnostics Via 11-Regularized Least Squares. IEEE Sensors Journal, 10(7):1218-1225, 2010.
[4] Stefan Schuet, Dogan Timuçin, and Kevin Wheeler. A model-based probabilistic inversion framework for characterizing wire defect detection using TDR. IEEE Transactions on Instrumentation and Measurement, 60(5): 1654-1663, 2011.
[5] Qinghua Zhang, Michel Sorine, and Mehdi Admane Inverse scattering for soft defect diagnosis in electric transmission lines. IEEE Transactions on Antennas and Propagation, 59(1):141-148, 2011.
[6] KR 100 957 812 (HOKMAH ENGINEERING CO LTD [KR] 13 May 2010.
[7] US 2013/204555 (SCHEUSCHNER SVEN [DE] ET AL) 8 Aug. 2013.
[8] Vladimir Dmitriev-Zdorov ET AL: «Computation of Time Domain Impedance Profile from S-Parameters: Challenges and Methods», 31 Dec. 2014.
[9] Anonymous "IConnect and MeasureXtractor Signal Integrity TDR and S-parameter Software", 1 Jan. 2007.
[10] Anonymous: "Agilent Technologies 8510C Network Analyzer System Operating and Programming Manual", 1 May 2001.
[11] H Tang ET AL "AN EFFICIENT INVERSE SCATTERING ALGORITHM AND ITS APPLICATION TO LOSSY ELECTRIC TRANSMISSION LINE SYNTHESIS", Progress In Electromagnetic Research Letters, 1 Jan. 2011.
[12] HUAIBIN TANG ET AL: "An Inverse Scattering Approach to Soft Fault Diagnosis in Lossy Electric Transmission Lines", IEEE TRANSACTIONS ON ANTENNAS AND PROPAGATION, IEEE SERVICE CENTER, PISCATAWAY, N.J., US, vol. 59, No. 10, 1 Oct. 2011

Document [7], presents a method for locating defects in a cable. A defect («cable defect») is defined as «all defects of the cable that would lead to unacceptable performance». Without distinction between the different types of defects, this method does not quantify them, but only locates them. This document mentions the example of insulation defect causing electrical arcs, which is not a resistive defect. In any case this method does not quantify a resistive defect, and therefore it does not detect, locate and quantify overheating resulting from power losses. FIG. 1 corresponds to a mathematical model of cables which contains parameters including the resistance R, but this document proposes no solution for calculating $R(z)$, which would need to resolve a mathematically non-trivial inverse problem, contrary to the invention.

Document [8] presents a method for calculating characteristic impedance which is not the linear resistance $R(z)$. In particular, a rise in impedance involves no power losses, while an increase in $R(z)$ is proportional to power losses known as «ohmic». This method does not quantify a resistive defect and any overheating.

Document [9] presents a device for measuring parameters of connections, but it does not propose measuring linear resistance $R(z)$, or any equivalent parameter. It does not quantify a resistive defect.

Document [10] relates to a user manual which mentions discontinuities at R, L or C, but the method makes no distinction between these 3 possible cases and therefore does not quantify resistive losses or detect defects which cause no discontinuity (soft defect).

Document [11] studies application of the theory of inverse scattering to the synthesis of transmission lines.

Document [12] studies the theory of inverse scattering for resolving an inverse problem of the electrical transmission line. As the solution is mathematically unstable, this method is not applicable in practice. The method in the invention represents a substantial advance relative to this article, with an algorithm having its stability confirmed by experiments.

The invention claimed is:

1. A method for detecting and locating defects on a cable, the method comprising the following steps:
- measuring values of voltage and current at ends of the cable and determining therefrom S-parameters of the cable, the S-parameters comprising reflection coefficients at both ends of the cable;
- determining, from S-parameters, a first apparent impedance of the cable $Z^l(z)$ from one end of the cable as a function of the position z along the cable, and a second apparent impedance of the cable $Z^r(z)$ from another end of the cable as a function of the position z along the cable;
- determining, from the first apparent impedance $Z^l(z)$ and the second apparent impedance $Z^r(z)$, an estimation of a linear resistance R(z) of the cable as a function of the position z along the cable, said estimation of the linear resistance R(z) being determined as:

$$R(z) = \frac{[Z^l(z) - Z^r(z)] - [Z^l(z+dz) - Z^r(z+dz)]}{2dz}$$

where dz is a spatial discretisation pitch related to the position z along the cable;
- detecting a defect on the cable at a position z along the cable if the estimation of the linear resistance R(z) at said position z is away from a reference value.

2. The method according to claim 1, wherein the first apparent impedance $Z^l(z)$ and the second apparent impedance $Z^r(z)$ are determined from a characteristic impedance of the cable which is estimated by steps consisting of executing an inverse Fourier transform of the reflection coefficients obtained for both ends of the cable, then solving integral Gel'fand-Levitan-Marchenko equations involving the inverse Fourier transform of the reflection coefficients.

3. The method according to claim 1, wherein the first apparent impedance $Z^l(z)$ and the second apparent impedance $Z^r(z)$ are determined from a characteristic impedance of the cable which is estimated by the steps consisting of:
- obtaining the inverse Fourier Transform of the S-parameter corresponding to reflection coefficients,
- solving integral Gel'fand-Levitan-Marchenko equations involving the inverse Fourier transform of the reflection coefficients, then
- calculating a potential function involving a solution of the integral Gel'fand-Levitan-Marchenko equations, obtaining the characteristic impedance of the cable as an exponential function of an integral of said potential function.

4. The method according to claim 1, wherein the reflection coefficients of the cable at both ends of the cable are obtained by connecting successively a charge adapted respectively to each end of the cable.

5. The method according to claim 1, wherein the reflection coefficients of the cable at both ends of the cable are obtained by connecting the two ends of the cable to two respective ports of an analyser.

6. The method according to claim 1, wherein the reflection coefficients of the cable are obtained on a frequency band and with a constant frequency pitch df.

7. A system for detection and location of defects on a cable, said system comprising:
- means for measuring values of voltage and current at ends of the cable and determining therefrom S-parameters comprising reflection coefficients of the cable at both ends of the cable;
- means for determining, from S-parameters, a first apparent impedance of the cable $Z^l(z)$ from one end of the cable as a function of the position z along the cable, and a second apparent impedance of the cable $Z^r(z)$ from another end of the cable as a function of the position z along the cable;
- means for determining, from the first apparent impedance $Z^l(z)$ and the second apparent impedance $Z^r(z)$, an estimation of a linear resistance R(z) of the cable as a function of the position z along the cable, said estimation of the linear resistance R(z) being determined as:

$$R(z) = \frac{[Z^l(z) - Z^r(z)] - [Z^l(z+dz) - Z^r(z+dz)]}{2dz}$$

where dz is a spatial discretisation pitch related to the position z along the cable;
- means for detecting a defect on a cable at a position z along the cable if the estimation of the linear resistance R(z) at said position z is away from a reference value.

8. The method of claim 3, wherein for determining the characteristic impedance, an intrinsic linear inductance L(z) of the cable at each position z and a linear capacity of the cable C(z) at each position z are searched, the characteristic impedance $Z_0$ corresponding to $$Z_0(z) = \sqrt{\frac{L(z)}{C(z)}}$$

and wherein a variable change is made so that the steps are performed on a variable x(z) corresponding to $$x(z) = \int_0^z \sqrt{L(s)C(s)}\, ds$$

9. The method of claim 8, wherein the inverse Fourier transform of a reflection coefficient is calculated as $$\rho(x) = \frac{1}{2\pi}\int_{-\infty}^{+\infty} r(\omega)\exp(j\omega x)d\omega$$

where r(ω) is a reflection coefficient, and wherein the integral Gel'fand-Levitan-Marchenko equations are solved for the kernels A1(x,y) and A2(x,y):

$$A_1(x, y) + \int_{-y}^{x} A_2(x, s)\rho(y+s)ds = 0$$

$$A_2(x, y) + \rho(x+y) + \int_{-y}^{x} A_1(x, s)\rho(y+s)ds = 0$$

and wherein the potential function q(x) is $q(x)=2A_2(x,x)$.

* * * * *